United States Patent [19]
Kornowski

[11] Patent Number: 5,136,346
[45] Date of Patent: Aug. 4, 1992

[54] PHOTON STIMULATED VARIABLE CAPACITANCE EFFECT DEVICES

[75] Inventor: Robert R. Kornowski, Schaumburg, Ill.

[73] Assignee: Motorola, Inc., Schaumburg, Ill.

[21] Appl. No.: 579,437

[22] Filed: Sep. 7, 1990

[51] Int. Cl.$^5$ .............................................. H01L 29/92
[52] U.S. Cl. ........................................ 357/14; 357/19; 357/30
[58] Field of Search ............... 357/14, 30 P, 19, 30 L, 357/30 B

[56] References Cited

U.S. PATENT DOCUMENTS

| | | | |
|---|---|---|---|
| 2,570,978 | 10/1951 | Pfann | 357/65 |
| 3,748,579 | 7/1973 | Henry et al. | 357/14 |
| 3,773,567 | 11/1973 | Gilespie | 357/16 |
| 3,798,508 | 3/1974 | Kohashi | 357/14 |
| 4,064,522 | 12/1977 | Shaw et al. | 357/16 |
| 4,481,487 | 11/1984 | Brehm et al. | 357/14 |
| 4,805,084 | 2/1989 | Rosen et al. | 357/30 P |

Primary Examiner—Andrew J. James
Assistant Examiner—Sara W. Crane
Attorney, Agent, or Firm—John W. Hayes

[57] ABSTRACT

A photon stimulated variable capacitance effect device that yields useful variations in capacitance responsive to changes in intensity of incident photons, while the operating point of the device is maintained near equilibrium.

13 Claims, 5 Drawing Sheets

PHOTO SIGNAL ACCOMMODATION IN RF SELF-RECTIFIED BIAS MODE OF OPERATION

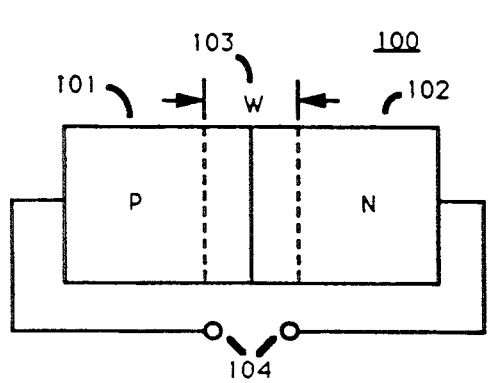
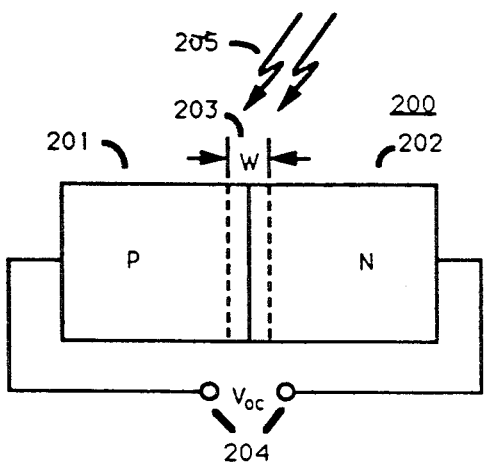
*Fig. 1a*  *Fig. 2a*
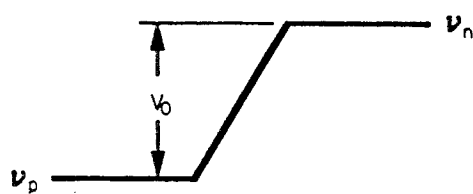
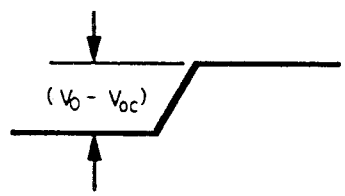
*Fig. 1b*  *Fig. 2b*
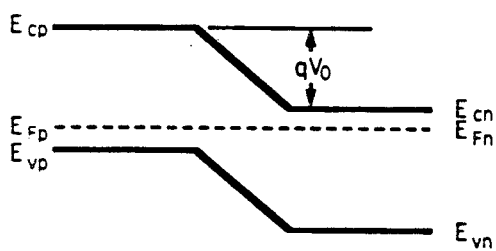
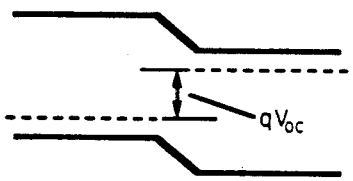
*Fig. 1c*  *Fig. 2c*

PHOTO SIGNAL ACCOMMODATION IN SELF-BIASED MODE OF OPERATION

PHOTO SIGNAL ACCOMMODATION IN RF SELF-RECTIFIED BIAS MODE OF OPERATION

PHOTO SIGNAL ACCOMMODATION IN EXTERNALLY BIASED MODE OF OPERATION

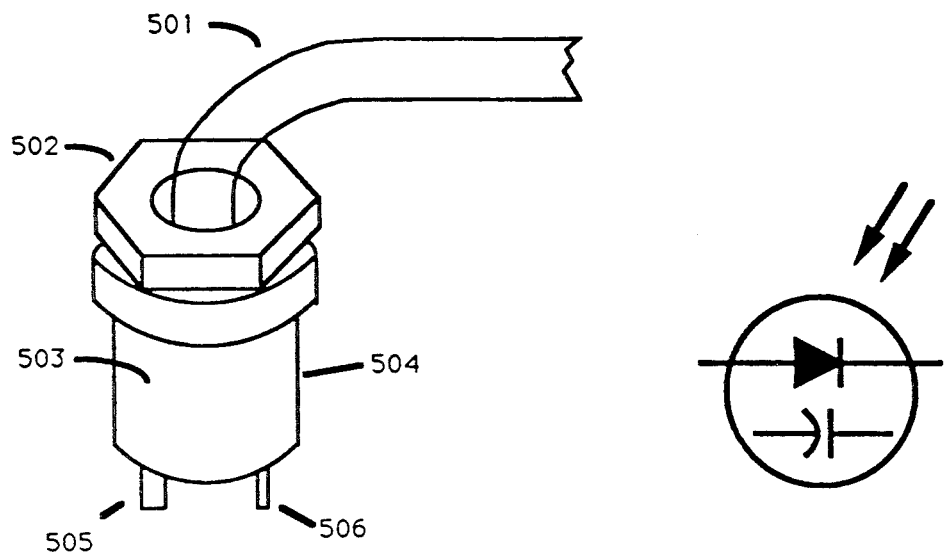
Fig. 5b
Fig. 5c
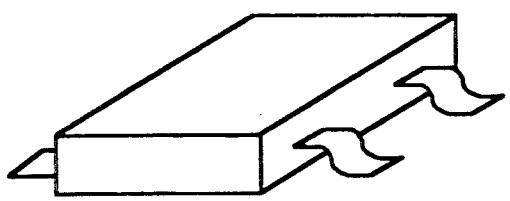
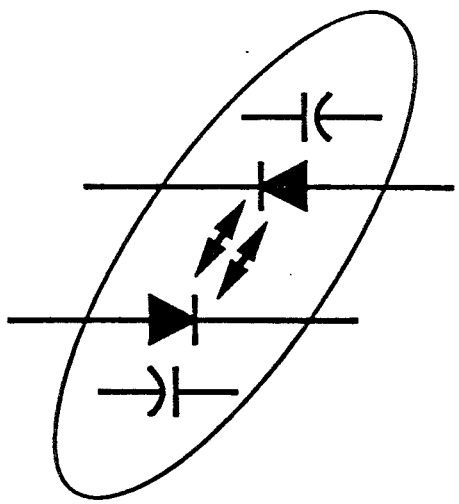
Fig. 6a
Fig. 6b

PHOTON STIMULATED VARIABLE CAPACITANCE EFFECT DEVICES

TECHNICAL FIELD

This invention relates generally to semiconductor devices and in particular to a semiconductor device utilizing a P/N junction's photovoltaic property, and is more particularly toward photon stimulated variable capacitance effect device wherein photon stimulation of the depletion region of the P/N junction produces a variable capacitance effect below the conduction threshold.

BACKGROUND OF THE INVENTION

Systems for optical transmission of information signals enjoy inherent advantages that have resulted in a proliferation of such systems in recent years. Optical systems employ carrier frequencies very close to visible light (infrared and ultraviolet are also used), so that fairly wide bandwidth modulation techniques may be used without fear of using up the available spectrum. In fact, amplitude modulation (AM) is often the technique of choice due to its ease of implementation with carrier signals in the visible light spectrum. Simply varying the current through an LED (light emitting diode) produces a direct amplitude modulation of the light energy.

In addition, optical systems are relatively immune to interference from external RF (radio frequency) transmissions, as well as the electromagnetic impulse of a nuclear explosion. Consequently, high-speed signaling with excellent signal-to-noise ratio performance results.

Of course, the use of optical systems for data or voice transmissions is generally restricted to solid waveguide media. These waveguides take the form of fiber optic cables, which are produced from synthetic materials having desirable optical qualities (high transmissivity, high index of refraction, etc.). The light energy is effectively trapped by the fiber optic cables and guided over relatively short distances by a network of such cable assemblies.

While this restriction to fiber optics is perfectly acceptable in common computer data networks such as LAN's (Local Area Networks), for transmission over longer distances it is frequently impracticable to rely upon fiber optics (length of cable required, unfavorable terrain features, desire to retain earthquake immunity, etc.). Microwave frequencies, transmitted through the air without fiber optic cables, are reliable for short-haul, point-to-point applications. For transmission of voice and data to communication units in the land mobile environment, lower frequency RF signals are almost universally employed.

Because of this necessary transition from carrier frequencies in the visible light spectrum to lower RF frequencies, and because AM modulation is generally rejected in the lower frequency communication spectrum in favor of FM (frequency modulation), various methods have been devised to convert the AM modulated light energy to an FM modulated RF carrier. FM modulated radio signals are superior to AM modulated radio signals with regard to preserving the integrity of transmitted signal information for two reasons: first, FM systems possess an intrinsic immunity to natural and man-made electromagnetic noise (which is amplitude varying), and, second, the capture effect of FM systems leads to greater communication reliability. The most common technique for converting AM to FM involves demodulating the information contained in the light wave using a phototransistor detector circuit, then applying the detector output to a varactor diode that forms the frequency determining element of a voltage controlled oscillator (VCO) to produce an FM signal.

The use of such conversion circuitry adds complexity and cost to communication systems that employ a combination of fiber optic networks and RF networks. Accordingly, a need arises for a method for simplifying the conversion of AM modulated light energy to FM modulated RF signals.

SUMMARY OF THE INVENTION

The above-described need is satisfied by a semiconductor device comprising at least one P/N junction with an associated depletion region having a predetermined width when junction operating point is substantially at equilibrium, the junction constructed and arranged to receive incident photons. The incident photons modulate the width of the depletion region to produce a photon stimulated variable capacitance effect, while the operating point is maintained substantially near equilibrium.

BRIEF DESCRIPTION OF THE DRAWINGS

FIG. 1a depicts the depletion region surrounding a P/N junction at equilibrium;

FIG. 1b shows electrostatic potential across the junction at equilibrium;

FIG. 1c is an energy band diagram for a P/N junction at equilibrium;

FIG. 2a is an illustration of the effect of incident light on depletion region width;

FIG. 2b shows the decrease in electrostatic potential in response to incident light;

FIG. 2c is an energy band diagram for a P/N junction exposed to impinging photons;

FIG. 5b is an illustration of a PSVCE device fiber optic link termination package;

FIG. 5c is a schematic symbol for the device of FIG. 5b;

FIG. 6a is an illustration of a typical PSVCE isolator device package; and

FIG. 6b is a schematic symbol for the device of FIG. 6a.

DETAILED DESCRIPTION OF THE INVENTION

Figure 3A:
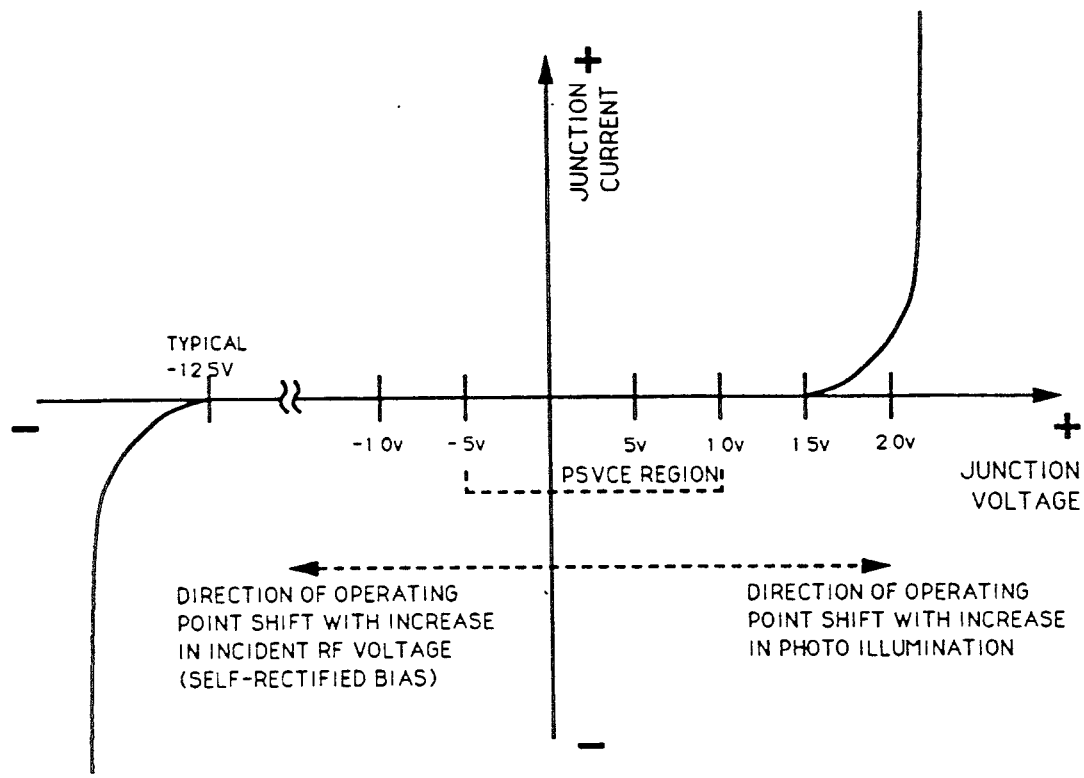
FIG. 3a illustrates the shift in gallium arsenide P/N junction operating point with changes in incident photon intensity and incident RF voltage.

A P/N junction forms at the boundary between two portions of intrinsic semiconductor material that have been "doped" by the addition of a donor impurity (to form N-type semiconductor) and an acceptor impurity (to form P-type semiconductor), respectively. Donor impurities "donate" free electrons to the crystal structure of the intrinsic material, creating an excess of negative charge carriers, thus the characterization as N-type material. The use of acceptor impurities results in "holes" in the crystal lattice where electrons would normally be, and, since the holes are thought of as positive charge carries, this type of mateerial is designated P-type.

FIG. 1a illustrates a P/N junction at equilibrium, as generally depicted by the number 100. The junction itself is indicated by the solid line separating portions of P-type material (101) from N-type material (102). As is well-known, a transition region (103) of width W, depicted by dashed lines in the figure, surrounds the physical boundary between the materials. This transition region is sometimes called a depletion region, since the area immediately surrounding the junction is effectively depleted of charge carriers due to recombination. Conductors (104) originating in the P-and N-type materials are shown terminating in open contacts, to indicate that no external voltage is applied to the device.

As is well-known in the art, a potential difference necessary to maintain the equilibrium state of the junction arises. This potential difference is called the built-in potential or contact potential, and is shown in FIG. 1b as $V_0$. This is the electrostatic potential that a charge carrier must overcome in traversing the junction.

FIG. 1c is the energy band diagram for the junction at equilibrium. For the P-type material, the valence band energy level ($E_{vp}$) is substantially closer to the Fermi level ($E_{Fp}$) than the conduction band energy level ($E_{cp}$). Of course, one would not expect to find free electrons in the conduction band in a P-type material. On the N side of the junction the converse situation obtains. The conduction band energy level ($E_{cn}$) is much closer to the Fermi level ($E_{Fn}$) than the valence band energy ($E_{vn}$), indicating a high probability of free electrons in the conduction band. The conduction band energy levels on opposite sides of the junction are separated by $qV_0$, where q is the charge on an electron, and $V_0$ is the built-in potential.

FIG. 2a illustrates the dramatic change in the width of the depletion region when the junction is exposed to incident light. When the energy of incident photons is greater than the energy of the band gap voltage, there is a finite probability that electron-hole pairs will be generated, and a forward voltage will appear across the junction.

The semiconductor device shown in FIG. 2a, as generally depicted by the number 200, has a P/N junction at the boundary between P-type material (201) and N-type material (202), just as previously described. When the junction is exposed to incident light (205), the width W of the transition region (203) becomes markedly smaller when compared to the width at equilibrium (FIG. 1a), and an open-circuit voltage, $V_{oc}$, appears at the contact terminals (204) of the device.

Of course, the electrostatic potenial across the transition region is reduced, when compared to the equilibrium value, by an amount equal to $V_{oc}$, as shown in FIG. 2b. This reduction in electrostatic potential brings the device closer to conduction. This fact is also illustrated by the energy band diagram of FIG. 2c. The difference in Fermi levels across the illuminated junction is $qV_{oc}$, meaning that charge carriers find it easier to traverse the transition region when the junction is illuminated by light of the proper frequency. Naturally, the value of $V_{oc}$ may not exceed $V_0$, the equilibrium contact potenial, since that is the maximum forward voltage that can appear across the junction.

One consequence of the variation of transition region width with the application of light energy is an observable change in capacitance across the device. Since charge carriers tend to collect at the limits of the transition region, one can analogize a P/N junction with a classical parallel plate capacitor, with the width of the transition region corresponding to plate separation. Just as capacitance of the parallel plate capacitor is inversely proportional to the distance between the plates, the capacitance across a P/N junction is inversely proportional to the width of the transition region.

The conventional application of this photon stimulated variable capacitance effect (PSVCE) is constrained to a limited range of operating voltages. FIG. 3a is a typical V-I (Voltage-Current) characteristic for a P/N junction. As indicated in the figure, the conventional PSVCE region is limited to those operating points that are close to junction equilibrium.

As discussed previously, incident light of the proper frequency causes the transition region to become narrower, resulting in an increase in capacitance. But if the forward voltage increases too much (past about 1.5 v. for a PSVCE device fabricated of gallium arsenide, as shown in the figure), the junction begins to conduct, and the capacitance effect becomes useless. In all applications, $V_{oc}$ must be maintained such that $V_{oc}$ has a lesser value than $V_0$ (the contact potential of the junction) for the junction to exhibit the useful capacitive characteristic. This shift in the operating point along the positive junction voltage axis is indicated in FIG. 3a as the direction of operating point shift with increase in photo illumination.

Figure 3B:
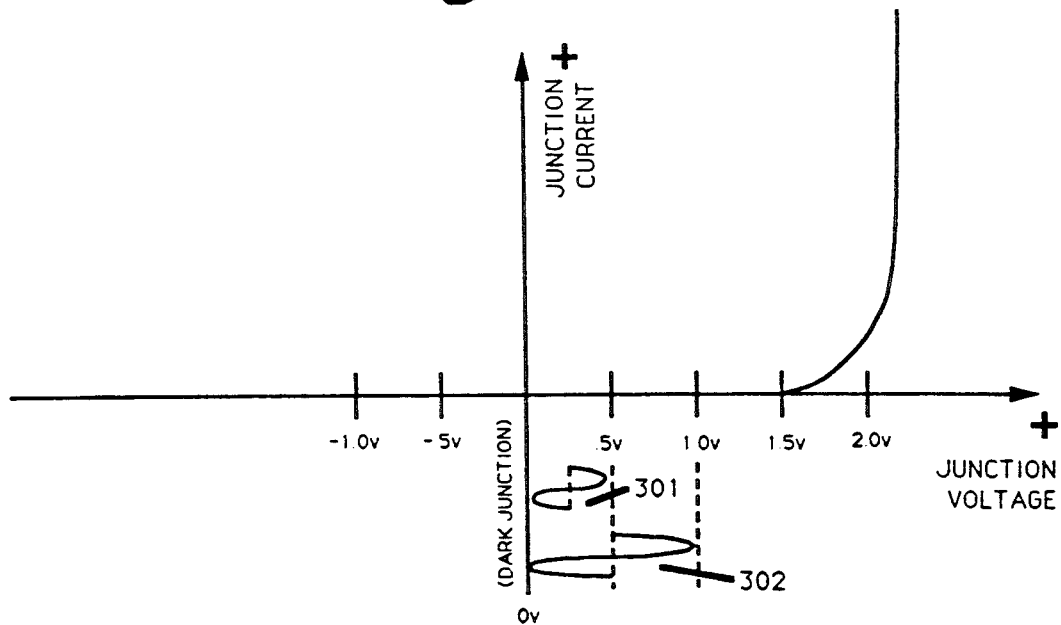
FIG. 3b shows the operating region of a self-biased PSVCE device with a small signal incident RF voltage.

A shift in the operating point toward a reverse biased condition results in an increase in the width of the transition region, with a corresponding decrease in the capacitance across the junction. This operating point shift along the negative junction voltage axis is indicated in the figure as the direction of operating point shift with increase in incident RF voltage (self-rectified bias). The conventional PSVCE device operating region is defined as follows. The conventional application of a PSVCE device involves a class of operation where peak-to-peak amplitude of the incident RF voltage from an associated RF oscillator circuit is substantially less than $qV_0$ (the difference in conduction band energy levels of the semiconductor materials forming the junction for a given range of incident photo illumination of the junction). This is the small signal class of self-biased (conventional) operation where the incident RF voltage is small with respect to the junction bandgap voltage. In this class of operation, a PSVCE device defines its own operating point (self-biased) as a function of the electrostatic potential of the photo illuminated P/N junction. The operating point for this class of operation would be as shown in FIG. 3b. The range of values of photo illumination is maintained such that the instantaneous voltage never approaches the threshold voltage, as illustrated by photo signal waveforms 301 and 302. Note that although sinusoidal waveforms are shown for purposes of illustration, the signal waveforms could have any arbitrary shape.

Typically, as previously discussed with reference to AM modulation in optical transmission systems, signal information is modulated onto the light wave carrier such that the PSVCE device junction is never allowed to go dark. This keeps the junction in "charge capture" by the photo illumination source. The photo source gives rise to varying degrees of charge liberation, none of which is of a sufficient magnitude to cause junction conduction.

An extension of this class of self biased operation involves incident RF voltages from an associated RF oscillator circuit of a sufficient magnitude to approach the conduction threshold of the PSVCE device junction, resulting in charge liberation and storage in the junction capacitance as a function of the self-rectification of the incident RF voltage. In this mode of operation, a self biased PSVCE device tends to extend its own useful range of operation by establishing an expanded operating region. This expanded operating region is the result of the shifted locus of the intrinsic contact potential of the P/N junction under the influence of the voltage produced by the point of equilibrium between the opposing voltages that result from self-rectification of the incident RF on the one hand, and photon charge liberation on the other. A greater incident RF voltage accommodates a greater maximum photo illumination.

The useful capacitance effect of a PSVCE device ceases to exist when P/N junction conduction results to any great extent. Therefore, this operating region lies near the limit of useful operation of a self-biased PSVCE device. In this region, the conversion sensitivity of a PSVCE device is reduced, and the limit of operation occurs at the point where significant RF self-rectification or photo currents result.

Figure 3C:
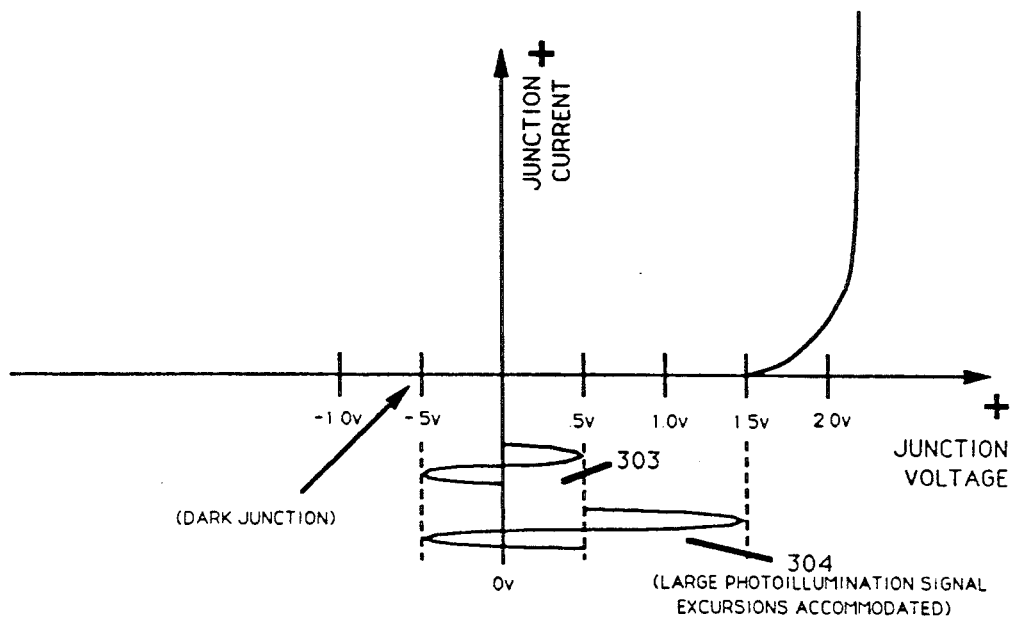
FIG. 3c illustrates the operating region of an RF self-rectification biased PSVCE device with a moderate signal incident RF voltage.

What has been described as the large signal class of self biased (conventional) operation, wherein a large incident RF voltage, of a magnitude approaching the conduction threshold of the PSVCE device P/N junction, is applied, produces an expanded operating region. The operating point for this class of operation is shown in FIG. 3c, where large excursions of photo illumination signals 303 and 304 are accommodated.

A second class of operation of a PSVCE device involves the application of an externally applied reverse bias. This bias is typically derived from a high impedance, RF decoupled current source. The reverse bias electrostatic charge modifies the operating point of the PSVCE device such that the dark junction point occurs at a larger negative voltage relative to the V-I characteristic of the P/N junction. A PSVCE device is operated in this mode to accommodate an incident RF voltage of greater magnitude while avoiding RF self-rectification, to accommodate a photo illumination signal of greater magnitude while avoiding the occurrence of a photo current, or to decrease the nominal magnitude of PSVCE device junction capacity.

Figure 3D:
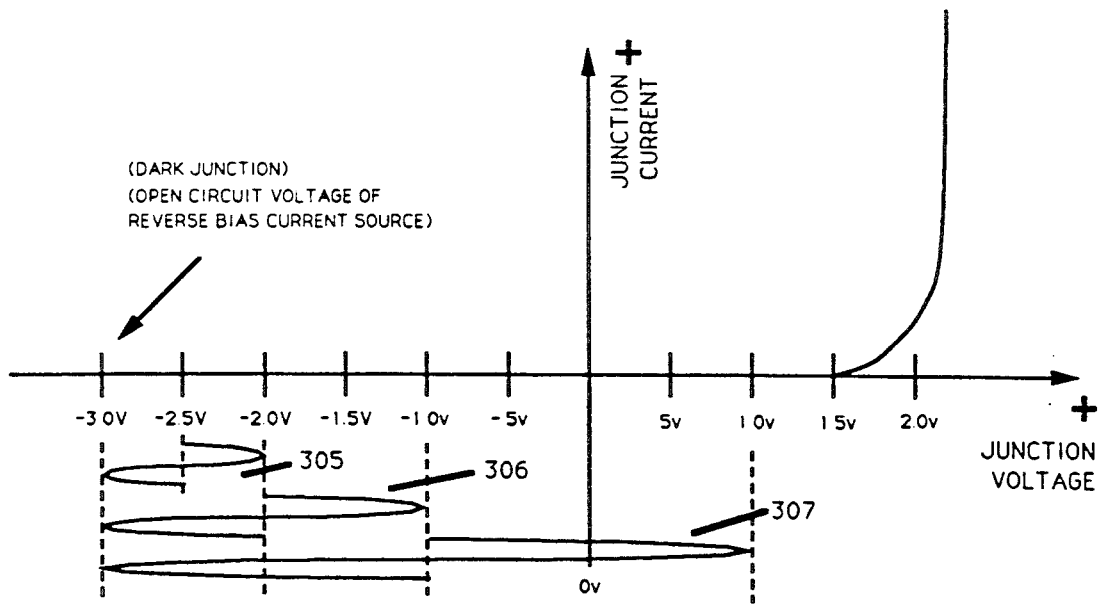
FIG. 3d depicts the operating region of an externally biased PSVCE device with large signal incident RF voltage.

Naturally, the open circuit voltage of the current source providing the external bias current must be chosen to be less than the reverse voltage breakdown limit of the PSVCE device P/N junction. In the external bias class of operation, the conversion sensitivity of a PSVCE device is reduced. The operating point for this class of operation is shown in FIG. 3d, with photo illumination signals 305, 306, and 307 added for illustration of relative amplitude for this mode of operation. As is evident from the foregoing discussions of operating modes, a PSVCE device is utilized to maximum advantage when the operating point is maintained near equilibrium (conventional small signal self biased class of operation).

Figure 4:
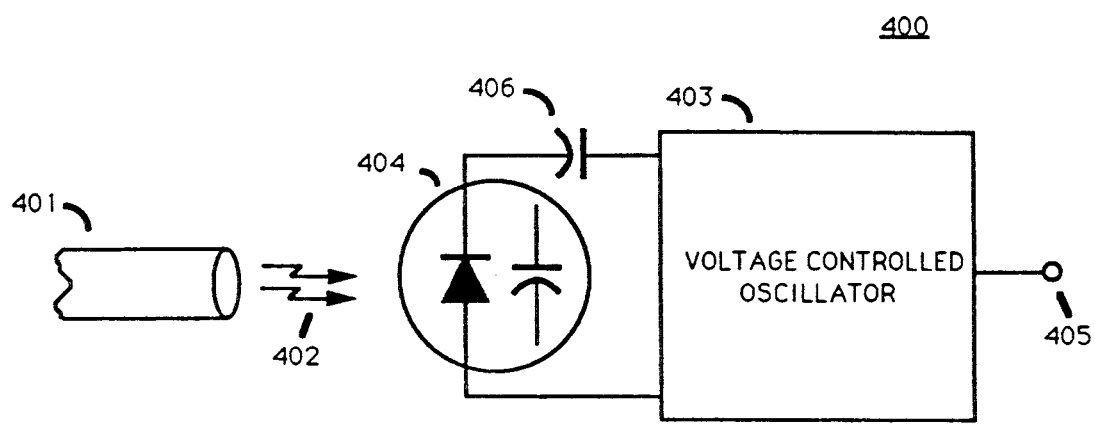
FIG. 4 shows a PSVCE device of the present invention as a frequency determining device in a VCO.

FIG. 4 is a block diagram of a network (generally depicted by the number 400) that is useful for converting AM modulated light energy into FM modulated RF. Direct FM modulation is most often effected through the use of a voltage controlled oscillator (VCO), wherein a steering voltage is applied to a voltage-variable capacitor (varactor) in the input of the VCO that acts as the frequency determining element. Changes in the steering voltage cause varactor capacitance to change, resulting in variations in frequency at the VCO output.

In FIG. 4, a PSVCE device (404) is used as the frequency determining element in the input of the VCO (403), with the PSVCE device (404) isolated from the VCO input by a DC (direct current) blocking capacitor (406). AM modulated light (402) provided through a fiber optic cable (401) is directed onto the PSVCE device. The intensity variations in the light (402) modulate the transition region width within the PSVCE (404), which in turn causes the capacitance of the PSVCE (404) to vary. This yields the desired frequency modulated RF signal at the VCO output (405).

Figure 5A:
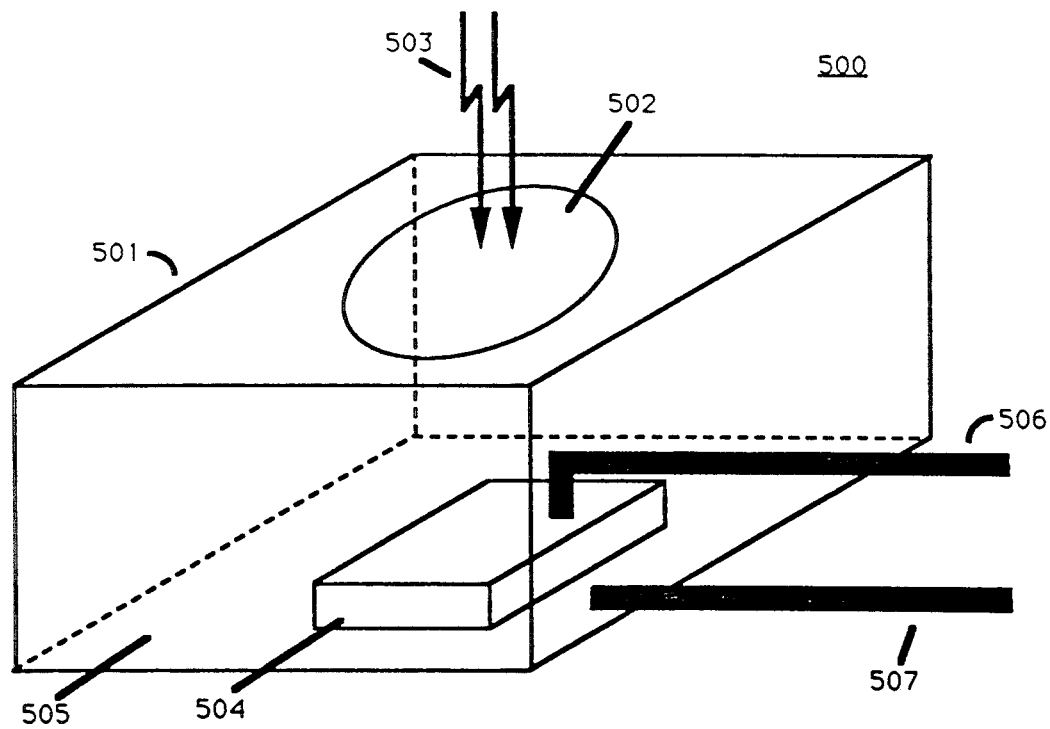
FIG. 5a illustrates a typical PSVCE receptor device package.

FIG. 5a is an illustration of a PSVCE receptor device package, generally depicted by the number 500. A PSVCE device (504) is mounted to a conductive base plate (505) that provides contact to one of the device regions (either the P-type of N-type material). A conductor (507) is attached to this plate and extends outside the package. Contact with the remaining region is implemented by direct attachment of a second conductor (506), that also extends outside the package. A cap (501) is placed over the base plate (505) to completely enclose the PSVCE device (504), and exclude unwanted light. The cap (501) is provided with a lens (502) to allow incident photons (503) to reach the device.

A PSVCE receptor device fiber optic package is shown in FIG. 5b. A PSVCE receptor device is mounted in a housing (503) which includes a flattened side (504) for polarity keying purposes. An optical fiber (501) enters the housing through an optical fiber retaining nut (502) that serves to secure the optical fiber (501) in place and prevent entry of unwanted light into the housing (503). Both a large contact pin (505) and a small contact pin (506) are utilized to make electrical contact with the PSVCE device and to aid in ensuring proper polarity. FIG. 5c shows a schematic symbol for a PSVCE receptor device.

The preceding discussion defines one type of PSVCE device (gallium arsenide receptor) in one application (direct format conversion from AM modulated light to FM modulated RF). Although reference has been made to gallium arsenide, any suitable semiconductor material may be utilized to fabricate a PSVCE device. Although it is well known in the art that diodes of gallium arsenide exhibit relatively high Q (quality factor), diodes fabricated from silicon exhibit lower noise and better thermal stability in RF applications.

PSVCE devices may be fabricated utilizing advanced semiconductor technology, such as optically transparent substrates. Light sensitive semiconductor devices on conventional opaque substrates require large junction surface areas to receive incident photo illumination. A device fabricated with an optically transparent substrate can employ a buried junction with smaller surface area. Since reduced junction area means less junction capacitance and less stored electrical charge in the junction, devices with greater conversion sensitivity and greater dynamic frequency response can be constructed using optically transparent substrate technology.

PSVCE devices constructed with multiple P/N junctions, typically connected in series electrically, exhibit even greater photo sensitivity, conversion sensitivity, a lower value of overall capacitance (by virtue of the series connection), and larger conduction threshold voltage. Of course, multiple P/N junctions threshold voltage. Of course, multiple P/N junctions may also be connected in parallel electrically. This parallel connection would permit applications such as linear optical combining, where separate optical sources are applied to separate parallel-connected junctions, resulting in a linear combination of the optical inputs. The design of a linear optical splitter can be accomplished by allowing the optical signal to impinge upon two or more PSVCE devices simultaneously, with each PSVCE device connected to associated circuitry.

The greater efficiency and frequency selective properties of tuned photo emitters, such as laser diodes, are well known in the art. Thus, a PSVCE device in the form of a laser diode emitter and/or receptor can be fabricated to take full advantage of these properties.

A PSVCE device comprising an emitter/receptor pair housed in a common package produces a PSVCE isolator that is not polarity sensitive. A PSVCE isolator package is illustrated in FIG. 6a, with a schematic symbol indicative of device function shown in FIG. 6b. Either or both the photo emitter and photo receptor could be comprised of multiple P/N junctions or cells.

A semiconductor device such as a transistor may be implemented as a self amplifying PSVCE device. Charge carriers liberated in the base/emitter junction of a phototransistor modulate the collector/emitter conductance of the device, causing corresponding changes in collector/base capacitance which can be used to advantage.

Beyond the AM to FM conversion example discussed above, PSVCE devices also have applications in isolators, tuning of electronic filters, automatic frequency netting in communication systems, and feedback loops.

What is claimed is:

1. A semiconductor device comprising:
   at least one P/N junction with an associated depletion region having a predetermined width when junction operating point is determined by a voltage produced by self-rectification of incident RF voltage;
   the junction constructed and arranged to receive incident photons;
   wherein the incident photons modulate the width of the depletion region to produce a photon stimulated variable capacitance effect, while the operating point is offset relative to P/N junction equilibrium by an amount substantially equal to the voltage produced by self-rectification of incident RF voltage.

2. The semiconductor device of claim 1, wherein said at least one P/N junction is fabricated from gallium arsenide.

3. The semiconductor device of claim 1, wherein said at least one P/N junction is fabricated from silicon.

4. The semiconductor device of claim 1, wherein said at least one P/N junction comprises multiple, series-connected P/N junctions.

5. The semiconductor device of claim 1, wherein said at least one P/N junction comprises multiple, parallel-connected P/N junctions.

6. The semiconductor device of claim 1, wherein said at least one P/N junction is constructed as a buried junction within an optically transparent substrate.

7. A semiconductor device comprising:
   at least one P/N junction with an associated depletion region having a predetermined width when junction operating point is determined by open circuit voltage of an externally applied high impedance current source;
   the junction constructed and arranged to receive incident photons;
   wherein the incident photons modulate the width of the depletion region to produce a photon stimulated variable capacitance effect, while the operating point is offset relative to P/N junction equilibrium by an amount substantially equal to the open circuit voltage of the externally applied high impedance current source.

8. The semiconductor device of claim 7, wherein said at least one P/N junction is fabricated from gallium arsenide.

9. The semiconductor device of claim 7, wherein said at least one P/N junction is fabricated from silicon.

10. The semiconductor device of claim 7, wherein said at least one P/N junction comprises multiple, series-connected P/N junctions.

11. The semiconductor device of claim 7, wherein said at least one P/N junction comprises multiple, parallel-connected P/N junctions.

12. The semiconductor device of claim 7, wherein said at least one P/N junction is constructed as a buried junction within an optically transparent substrate.

13. A semiconductor device comprising:
   first and second PSVCE devices within a single package;
   wherein a first external circuit coupled to the first PSVCE device and a second external circuit coupled to the second PSVCE device are electrically isolated from one another.

* * * * *